(12) United States Patent
Lin et al.

(10) Patent No.: US 6,693,800 B1
(45) Date of Patent: Feb. 17, 2004

(54) EXPANSION CARD MOUNTING APPARATUS

(75) Inventors: Kuo-Chih Lin, Tu-Chen (TW); Quan-Guang Du, Shenzhen (CN); Li Tong, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/324,169

(22) Filed: Dec. 18, 2002

(30) Foreign Application Priority Data

Oct. 25, 2002 (TW) ..................................... 91217046 U

(51) Int. Cl.[7] .................................................. H05K 5/06
(52) U.S. Cl. ........................ 361/759; 361/732; 361/747; 361/683; 361/682; 211/41.17
(58) Field of Search ................................. 361/825, 683, 361/684, 686, 682, 759, 732, 726, 747; 211/41.17

(56) References Cited

U.S. PATENT DOCUMENTS 5,673,175 A * 9/1997 Carney et al. .............. 361/686
6,480,393 B1 * 11/2002 Chen ........................... 361/759

* cited by examiner

Primary Examiner—David Martin
Assistant Examiner—Hung Bui
(74) Attorney, Agent, or Firm—WeiTe Chung

(57) ABSTRACT

A mounting apparatus for attaching expansion cards (60) to a computer enclosure includes a fastening member (10), a retaining bracket (30), and a rear panel (50). The fastening member includes a spring finger (12) and two opposite sidewalls (14). A pair of pivot pins (141) perpendicularly extends from outside faces of bottom ends of the sidewalls respectively, and a protrusion (143) is formed on one of the sidewalls. The retaining bracket includes a main body (34) and a pressing body (32)). A catch opening (341) and an aperture (343) are defined in the main body, for receiving the spring finger and the protrusion respectively. A support plate (54) is bent perpendicularly outwardly from the rear panel. The fastening member is pivotably attached to the retaining bracket. The main body is slidably attached to the rear panel. The expansion cards are retained between the support plate and the pressing body.

16 Claims, 5 Drawing Sheets

EXPANSION CARD MOUNTING APPARATUS

BACKGROUND OF THE INVENTION

1. Field of the Invention

The present invention relates to a mounting apparatus for electronic equipment, and more particularly to a mounting apparatus for expansion cards of a computer. This application relates to the copending application titled "EXPANSION CARD MOUNTING APPARATUS" filed on the same date having the same inventors and assignee with the invention.

2. Description of the Related Art

Personal computers (PCs) often need to exchange information with external devices such as digital cameras. An appropriate expansion card can be attached to a motherboard in a computer enclosure, the expansion card providing the hardware necessary for connection of the external device with the PC. The expansion card comprises a printed circuit board (PCB) and a slot cover. A bent end portion of the slot cover defines a cutout. A support plate is stamped outwardly from a rear panel of the computer enclosure. A hole is defined in the support plate. The expansion card is fixed to the rear panel by passing a screw through the cutout and engaging the screw in the hole. However, attachment with a screw is unduly complicated and time consuming, particularly when several expansion cards are fixed to the rear panel. In addition, a tool is usually required for installation and removal of the screws.

SUMMARY OF THE INVENTION

Accordingly, an object of the present invention is to provide an expansion card mounting apparatus which can conveniently attach an expansion card to a computer enclosure.

To achieve the above object, an expansion card mounting apparatus in accordance with the present invention comprises a rear panel, a fastening member and a retaining bracket. A support plate is bent perpendicularly out from the rear panel. The rear panel defines a pair of latch slots therein. The fastening member comprises a spring finger and a pair of opposite sidewalls. A wedge-shaped catch is formed near a free end of the spring finger. A pair of pivot pins perpendicularly extends from outside faces of bottom ends of the sidewalls respectively, and a protrusion is formed on a front edge of one of the sidewalls. The retaining bracket comprises a main body and a pressing body. A catch opening and an aperture are defined in the main body, for receiving the spring finger and the protrusion of the fastening member respectively. A pair of latches is stamped inwardly from the main body, for movably engaging in the latch slots of the rear panel respectively. The fastening member is pivotably attached to the retaining bracket. The main body is slidably attached to the rear panel. The expansion cards are retained between the support plate of the rear panel and the pressing body of the retaining bracket.

Other objects, advantages and novel features of the present will be drawn from the following detailed description of preferred embodiments of the present invention with the attached drawings, in which:

DESCRIPTION OF THE PREFERRED EMBODIMENT

Figure 1:
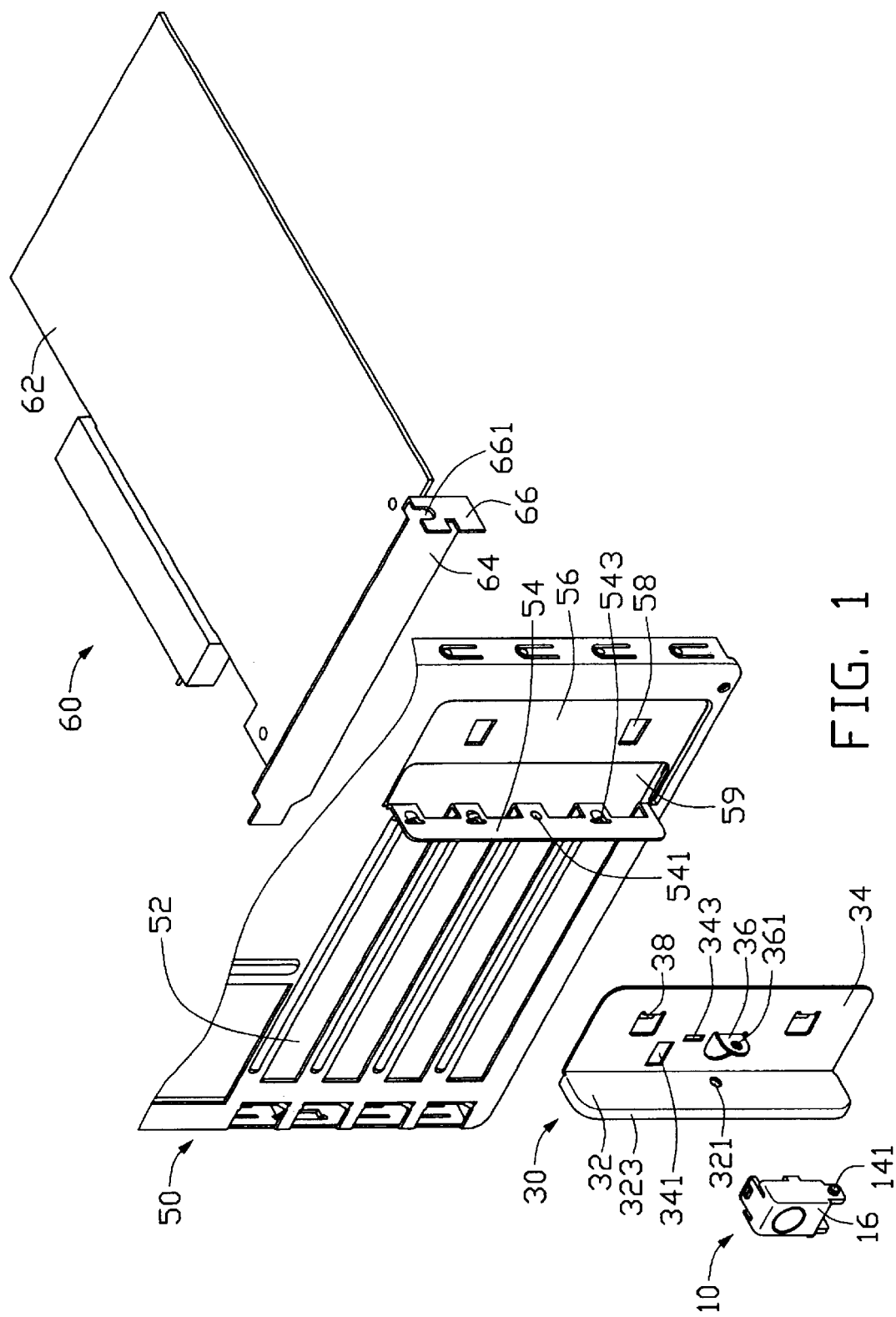
FIG. 1 is an exploded, isometric view of an expansion card mounting apparatus in accordance with a preferred embodiment of the present invention together with an expansion card, the expansion card mounting apparatus comprising a rear panel, a retaining bracket, and a fastening member.
Figure 2:
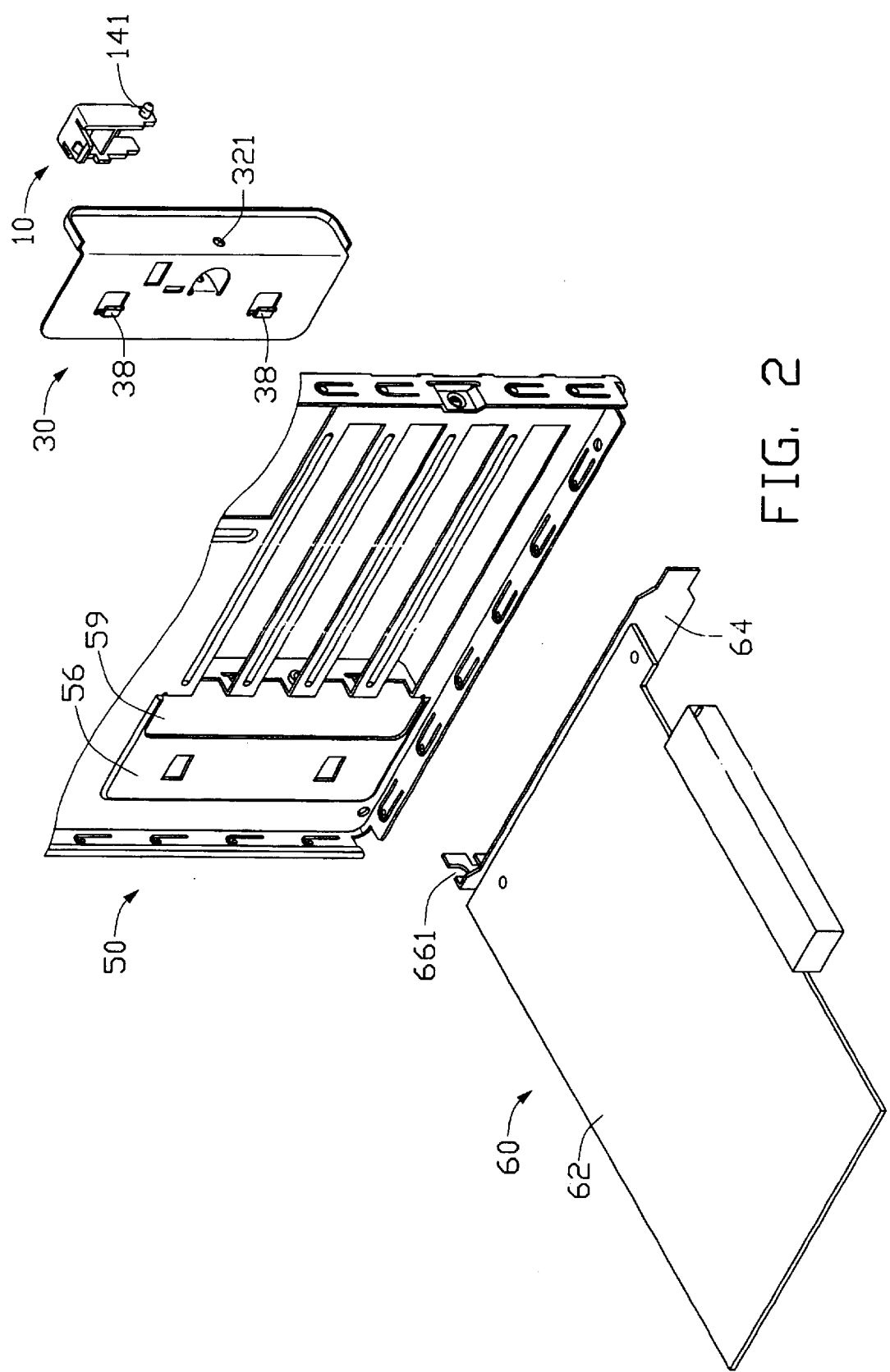
FIG. 2 is similar to FIG. 1, but viewed from another aspect.
Figure 3:
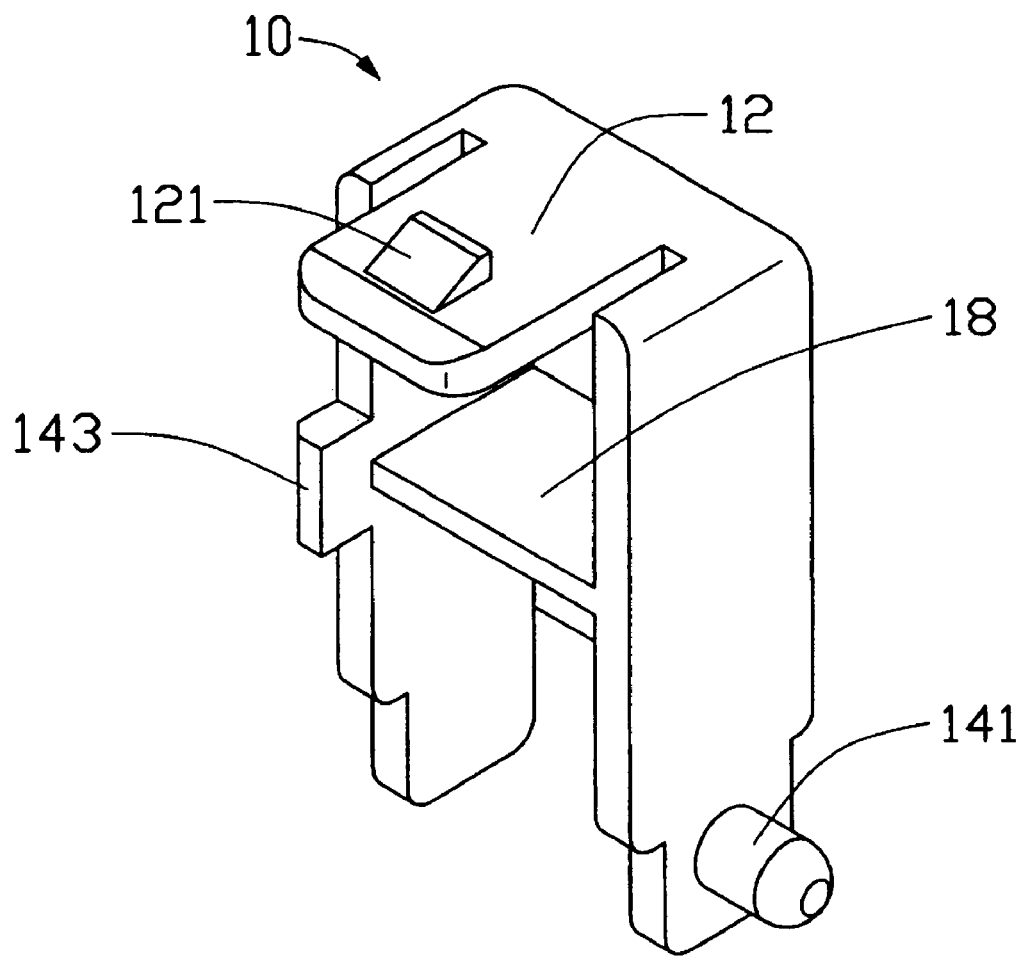
FIG. 3 is an enlarged, isometric view of the fastening member of the expansion card mounting apparatus of FIG. 1.

Referring to FIGS. 1 to 3, a mounting apparatus in accordance with a preferred embodiment of the present invention is provided for attaching an expansion card 60 to a computer enclosure. The mounting apparatus comprises a fastening member 10, a retaining bracket 30 and a rear panel 50.

The fastening member 10 comprises a base wall 16, a spring finger 12 extending from a top end of the base wall 16, and a pair of opposite sidewalls 14. A wedge-shaped catch 121 is outwardly formed near a free end of the spring finger 12. A rib 18 is formed between middle portions of the sidewalls 14, for strengthening the fastening member 10. A protrusion 143 is formed on a front edge portion of one of the sidewalls 14, adjacent the rib 18. A pair of pivot pins 141 perpendicularly extends from outside faces of bottom ends of the sidewalls 14 respectively.

The retaining bracket 30 is generally an orthogonally bent plate, and comprises a main body 34 and a pressing body 32 bent perpendicularly from an inner edge of the main body 34. A pivot hole 321 is defined in a middle portion of the pressing body 32. A narrow flange 323 extends perpendicularly inwardly from three free edges of the pressing body 32. A supporting plate 36 is perpendicularly bent from a middle portion of the main body 34, such that the supporting plate 36 is parallel to the pressing body 32. A pivot hole 361 is defined in the supporting plate 36, corresponding to the pivot hole 321. The pivot holes 321, 361 are for respectively receiving the pivot pins 141 of the fastening member 10. A catch opening 341 is defined in an upper portion of the main body 34 adjacent the pressing body 32, for receiving the spring finger 12 of the fastening member 10. An aperture 343 is defined in the main body 34 generally between the catch opening 341 and the supporting plate 36, for receiving the protrusion 143 of the fastening member 10. A breadth between the aperture 343 and the pressing body 32 is slightly less than a width of the fastening member 10 spanning the sidewalls 14. A pair of parallel, curved latches 38 is stamped inwardly from the main body 34.

The rear panel 50 comprises a recessed portion 56 at one side thereof. A vertical support plate 54 is bent perpendicularly outwardly from the recessed portion 56. An opening 59 is thus defined in the recessed portion 56 adjacent the support plate 54. A plurality of spaced parallel horizontal expansion slots 52 is defined in the rear panel 50. The expansion slots 52 respectively communicate with the opening 59. An engaging hole 541 is defined in a middle portion of the support plate 54, above one of the expansion slots 52. The engaging hole 541 corresponds to the pivot hole 321 of the retaining bracket 30. A plurality of projections 543 is formed on a face of the support plate 54 that is nearest the recessed portion 56. Each projection 543 is located above a respective expansion slot 52. However, there is no projection 543 above the expansion slot 52 that corresponds to the engaging hole 541. A pair of vertically spaced latch slots 58 is defined in the recessed portion 56, for receiving the latches 38 of the retaining bracket 30.

The expansion card 60 comprises a printed circuit board 62, and a slot cover 64 perpendicularly disposed at an end edge of the printed circuit board 62. A perpendicularly bent end portion 66 of the slot cover 64 defines a cutout 661 in a top part thereof. A configuration of the cutout 661 corresponds to a configuration of any of the projections 543 of the support plate 54 of the rear panel 50.

Figure 4:
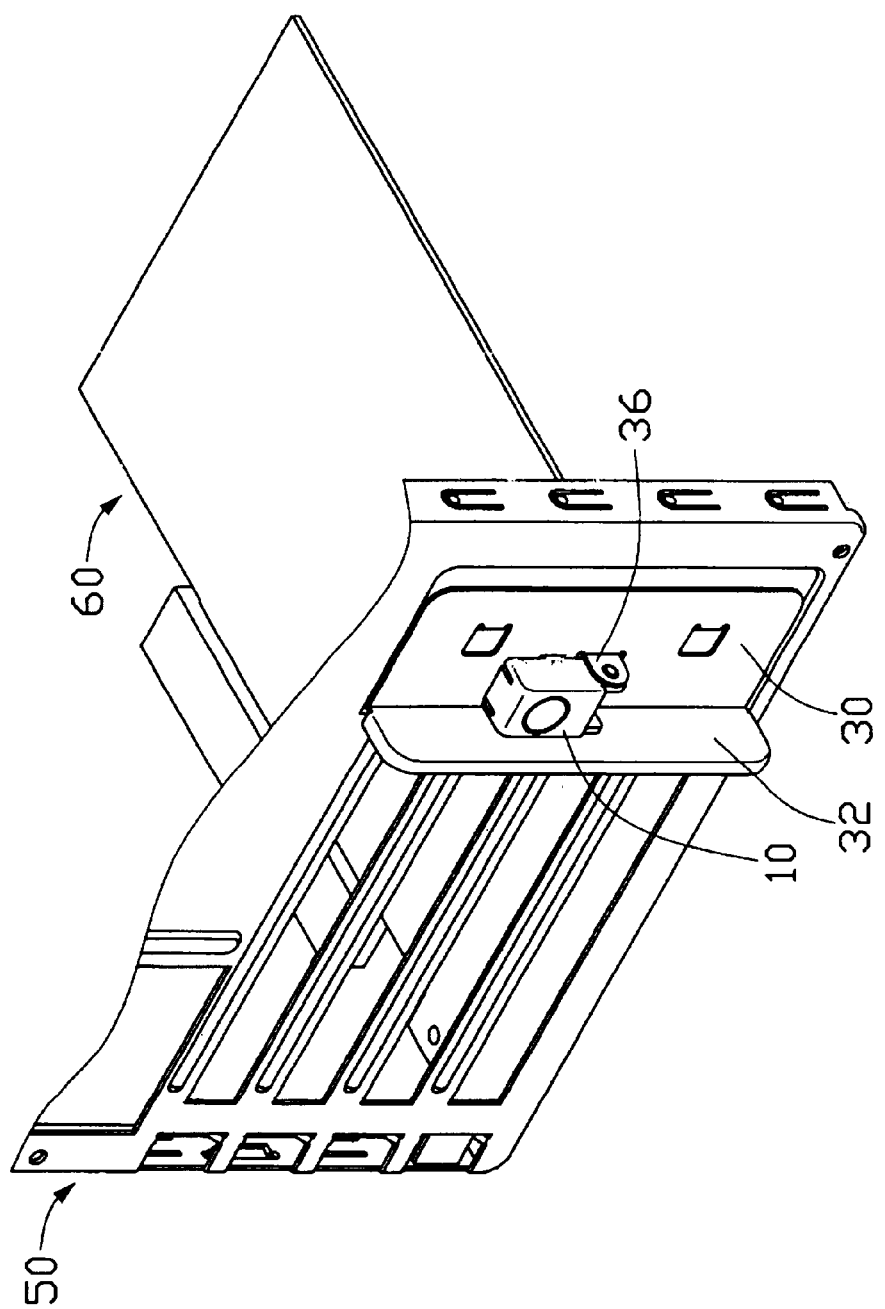
FIG. 4 is an assembled view of FIG. 1.
Figure 5:
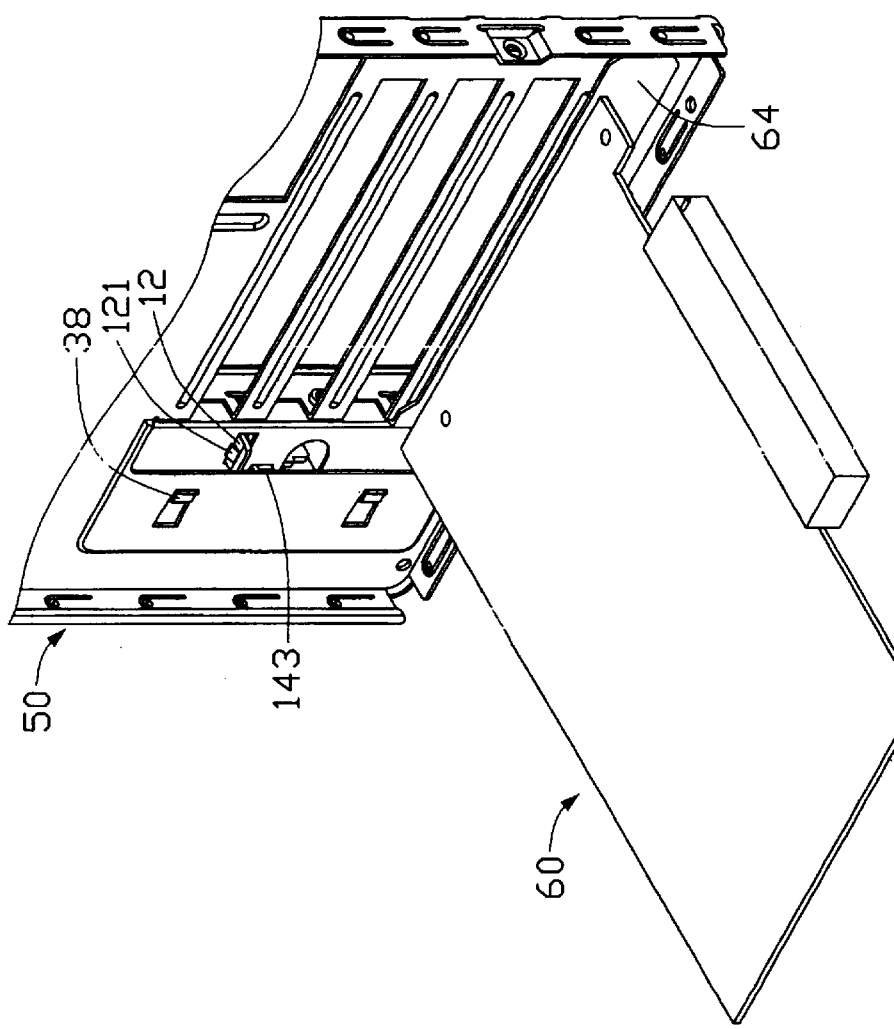
FIG. 5 is similar to FIG. 4, but viewed from another aspect.

Referring to FIGS. 4 and 5, in assembly and use of the mounting apparatus, the expansion card 60 is first attached to a motherboard (not shown) in the computer enclosure. The expansion card 60 is positioned so that the slot cover 64 covers one of the expansion slots 52, and the end portion 66 of the slot cover 64 contacts the support plate 54. The corresponding projection 543 of the support plate 54 is received in the cutout 661 of the end portion 66. Then the fastening member 10 is pivotably attached to the retaining bracket 30, with the pivot pins 141 of the fastening member 10 being received in the pivot holes 321, 361 respectively of the retaining bracket 30.

The combined fastening member 10 and retaining bracket 30 is then movably attached to the recessed portion 56 of the rear panel 50. The latches 38 of the retaining bracket 30 are inserted through the latch slots 58 of the recessed portion 56, and the recessed portion 56 is clamped between the latches 38 and the main body 34. Then the retaining bracket 30 is slid toward the support plate 54 of the rear panel 50. The pivot pin 141 adjacent the support plate 54 of the rear panel 50 is received in the engaging hole 541 of the support plate 54. The flange 323 of the retaining bracket 30 abuts three free edges of the support plate 54. Then the fastening member 10 is rotated toward the rear panel 50 until the spring finger 12 is received in the catch opening 341 of the main body 34 and the opening 59 of the rear panel 50. Simultaneously, the protrusion 143 is received in the aperture 343 of the main body 34 and the opening 59 of the rear panel 50. The catch 121 of the spring finger 12 snappingly engages with an inner surface of the main body 34, thus preventing the fastening member 10 from accidentally disengaging from the main body 34. The protrusion 143 abuts an edge of the recessed portion 56 in communication with the opening 59, thus preventing the combined fastening member 10 and retaining bracket 30 from accidentally sliding away from the support plate 54. In addition, the width of the fastening member 10 spanning the sidewalls 14 is slightly greater than the breadth between the aperture 343 and the pressing body 32 of the retaining bracket 30. Accordingly, the fastening member 10 pushes the pressing body 32 toward the support plate 54. The expansion card 60 is thus surely attached to the rear panel 50, with the end portion 66 of the expansion card 60 sandwiched between the support plate 54 of the rear panel 50 and the pressing body 32 of the retaining bracket 30.

To remove the expansion card 60 from the rear panel 50, the spring finger 12 of the fastening member 10 is pressed downwardly to release the catch 121 from the main body 34 of the retaining bracket 30. The fastening member 10 is rotated away from the main body 34. The retaining bracket 30 is slid away from the support plate 54. The expansion card 60 is then easily pulled away from the rear panel 50.

In the expansion card mounting apparatus of the present invention, the retaining bracket 30 is movably attached to the rear panel 50. When removing or installing the expansion card 60, it is not necessary to detach the retaining bracket 30 from the rear panel 50. This allows quick and convenient removal and installation of the expansion card 60.

Although only one expansion card 60 is used in the above description, the expansion card mounting apparatus of the present invention is equally capable of mounting a plurality of expansion cards 60 at the same time.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A mounting apparatus for attaching expansion cards to a computer enclosure, comprising:

a panel, a support member extending outwardly from the panel, an opening defined in the panel adjacent the support member;

a retaining bracket slidably attached to the panel, the retaining bracket comprising a main body and a pressing body, a catch opening defined in the main body coinciding with the opening, an aperture defined in the main body; and a fastening member pivotably attached to the retaining bracket, the fastening member comprising a spring finger and a pair of sidewalls, a catch formed at the spring finger engaging at the catch opening of the retaining bracket, a protrusion being formed on one of the sidewalls and extending through the aperture of the retaining bracket to abut against the panel in the opening thereof;

whereby the fastening member pushes the pressing body of the retaining bracket toward the support member of the panel to cause the expansion cards to be retained between the support member and the pressing body.

2. The mounting apparatus as claimed in the claim 1, wherein the panel further comprises a recessed portion, a plurality of latch slots is defined in the recessed portion, and a plurality of latches extends from the main body of the retaining bracket, the latches slidably engaging in the latch slots respectively.

3. The mounting apparatus as claimed in the claim 1, wherein a supporting plate is arranged on the main body of the retaining bracket, a pair of pivot holes is defined in the pressing body and the supporting plate respectively, and a pivot protrudes perpendicularly outwardly from an end portion of each of the sidewalls of the fastening member, the pivots being received in the pivot holes of the retaining bracket.

4. The mounting apparatus as claimed in the claim 3, wherein a hole is defined in the support member of the panel corresponding to the pivot hole of the pressing body of the retaining bracket, the hole of the support member receiving a corresponding pivot of the fastening member therein.

5. The mounting apparatus as claimed in the claim 1, wherein a plurality of projections is arranged on the support member of the panel, for being received in cutouts of the expansion cards respectively.

6. The mounting apparatus as claimed in the claim 1, wherein the fastening member further comprises a base wall connecting between the sidewalls.

7. The mounting apparatus as claimed in the claim 6, wherein a rib is provided between the sidewalls of the fastening member for strengthening the fastening member.

8. The mounting apparatus as claimed in the claim 1, wherein a breadth between the aperture and the pressing body is slightly less than a width of the fastening member spanning the sidewalls.

9. A mounting apparatus assembly comprising:
   a plurality of expansion cards each comprising a slot cover;
   a panel, a support member extending outwardly from the panel, a plurality of expansion slots defined in the panel receiving the slot covers of the expansion cards respectively, an opening defined in the panel adjacent the support member, a plurality of latch slots defined in the panel near the opening;
   a retaining bracket slidably attached to the panel, the retaining bracket comprising a main body covering the opening and a pressing body abutting the support member, a catch opening defined in the main body, an aperture defined in the main body; and
   a fastening member pivotably attached to the retaining bracket, the fastening member comprising:
      a spring finger detachably engaging with the main body in the catch opening; and
      a pair of sidewalls, a protrusion provided on one of the sidewalls extending through the aperture of the retaining bracket to abut against the panel;
      whereby the fastening member pushes the pressing body toward the support member to sandwich the slot covers between the support member and the pressing body.

10. The mounting apparatus assembly as claimed in the claim 9, wherein a catch is provided at the spring finger, the catch being received through the catch opening of the retaining bracket and in the opening of the panel to snappingly engage with the main body.

11. The mounting apparatus assembly as claimed in the claim 10, wherein the catch is wedge-shaped.

12. The mounting apparatus assembly as claimed in the claim 9, wherein the slot cover comprises a bent end portion sandwiched between the pressing body of the fastening member and the support member of the panel, a cutout is defined in the bent end portion, a plurality of projections is arranged on the support member of the panel, and a corresponding one of the projections is received in the cutout of the slot cover.

13. The mounting apparatus assembly as claimed in the claim 9, wherein a breadth between the aperture and the pressing body is slightly less than a width of the fastening member spanning the sidewalls.

14. A mounting apparatus assembly comprising:
   a rear panel;
   a support plate extending perpendicular to said rear panel;
   a plurality of slots formed under said support plate to receive slot covers which are located on an inner side of the rear panel;
   a retaining bracket detachably attached to said rear panel with a pressing body abutting against the support plate with tip portions of said slot covers sandwiched therebetween; and
   a fastening device pivotally equipped with said bracket with means for fixing the bracket to at least one of said rear panel and said support plate.

15. The assembly as claimed in claim 14, wherein said support plate extends on an outer side of the rear panel.

16. The assembly as claimed in claim 15, wherein said bracket is positioned on the outer side of the rear panel.

* * * * *